United States Patent [19]
Burnette

[11] Patent Number: 5,956,606
[45] Date of Patent: Sep. 21, 1999

[54] METHOD FOR BUMPING AND PACKAGING SEMICONDUCTOR DIE

[75] Inventor: Terry Burnette, Braunfels, Tex.

[73] Assignee: Motorola, Inc., Schaumburg, Ill.

[21] Appl. No.: 08/962,008

[22] Filed: Oct. 31, 1997

[51] Int. Cl.$^6$ .................................................. H01L 21/44
[52] U.S. Cl. .......................... 438/615; 438/612; 438/613
[58] Field of Search .................................... 438/615, 612, 438/613

[56] References Cited

U.S. PATENT DOCUMENTS

| | | | |
|---|---|---|---|
| 5,222,014 | 6/1993 | Lin | 361/414 |
| 5,658,827 | 8/1997 | Aulicino et al. | 438/615 |
| 5,726,079 | 3/1998 | Johnson | 438/106 |

OTHER PUBLICATIONS

Marie S. Cole et al., "A Review of Available Ball Grid Array (BGA) Packages", published by SMTA, Edina, MN, 1995, pp. 207–213.

Donald R. Banks et al., "Reliability Comparison of Two Metallurgies for Ceramic Ball Grid Array", 3rd International Exposition on Multichip Modules, Apr. 13–15, 1994, Rev. Oct. 10, 1994, pp. 53–57.

Donald R. Banks et al, "Assembly and Reliability of Ceramic Column Grid Array", published by SMTA, Edina, MN, 1995, pp. 271–276.

Andrea Lawrence et al., "High Volumn Assembly of Ceramic Column Grid Array (CCGA)", published by SMTA, Edina, MN, 1995, pp. 116–122.

*Primary Examiner*—KEvin M. Picardat
*Assistant Examiner*—Deven Collins

[57] ABSTRACT

An electrical interconnect structure, including a first component (300), a second component (320), and an electrical interconnect electrically and mechanically interconnecting the first component to the second component, the electrical interconnect including a first solder sphere (314) and a second solder sphere (318) stacked on each other. A semiconductor die (200, 100) that is bumped and packaged utilizing the electrical interconnect structure is also disclosed.

19 Claims, 3 Drawing Sheets

METHOD FOR BUMPING AND PACKAGING SEMICONDUCTOR DIE

FIELD OF THE INVENTION

The present invention is drawn to a new electrical interconnect structure, particularly an electrical interconnect structure for providing first-level interconnection between a semiconductor die and a substrate, and second-level interconnection between a substrate and a printed circuit board.

BACKGROUND OF THE INVENTION

In modern semiconductor manufacturing, reliability of good die and semiconductor devices is critically important. In packaging semiconductor die, a 100% reliability is optimal. Currently, one common technique of packaging a semiconductor die is to flip-chip join a semiconductor die to a ceramic substrate. According to this technique, the active surface of the semiconductor die is "bumped", and the bumps are reflowed while in contact with an array of solder pads on a substrate to provide electrical and mechanical interconnection. Electrical traces extend through the substrate to an opposing major surface thereof, the electrical traces being routed to an array of solder pads which are spaced apart from each other on a much larger scale than the bumps of the die. This known technique is illustrated in FIGS. 1 to 4.

FIG. 1 illustrates a conventional structure including a semiconductor die 10 attached to a ceramic substrate 14 by a plurality of bumps 12. As shown, the ceramic substrate 14 has a plurality of solder pads 16, as are well known in the art. Bumps 12 are generally formed by the known "controlled collapse chip connection" technology, alternatively known as C4 technology. After bumps 12 are formed on semiconductor die 10, they are reflowed at a relatively high temperature, such as 360° C., to form an electrical and mechanical interconnect between the semiconductor die and the ceramic substrate 14. The C4 bumps are generally formed of a high lead solder, such as 90 Pb/10 Sn (90% Pb, 10% Sn). Then, as shown in FIG. 2, a plurality of solder spheres 22 are placed in a conventional graphite boat, which provides a carrier for the solder spheres 22. Like the solder of bumps 12, solder spheres 22 are also formed of a high lead solder.

A solder paste 24 is then screen-printed over the solder spheres 22 provided in the graphite boat, and the ceramic substrate 14 and the solder spheres 22 are joined. Particularly, the solder paste 24 is comprised of flux and a low melting temperature solder component, such as 63 Sn/37 Pb. To effect joining of the solder spheres to the solder pads 16 of substrate 14, heating is carried out at a temperature on the order of 210° C. After heating, a final package is shown in FIG. 4, which, in this particular embodiment, forms a ceramic ball grid array 26.

With increasing I/O densities of the die, larger substrates are typically required. For example, 21 by 21 millimeter and 25 by 25 millimeter ceramic substrates are currently utilized in production. However, due to the ever increasing I/O count of the semiconductor die, it would be desirable to utilize a larger substrate, such as on the order of 32 by 32 millimeter, and 35 by 35 millimeter. However, such large-sized substrates are generally difficult to employ, because of the thermal expansion coefficient mismatch between the substrate and the printed circuit board. As the size of the ceramic substrate increases, this difference in degree of thermal expansion becomes more problematic due to the higher shear strain generated between the ceramic substrate and the printed circuit board during heat cycling.

In addition, it is also a goal to eliminate as many packaging components and process steps as possible, with an ultimate objective of achieving direct semiconductor die to printed circuit board connection. However, such a direct connection is not pragmatic in view of the large differences in thermal expansion coefficients. Such a mismatch requires an underfill provided between the semiconductor die and the printed circuit board, the underfill providing matching thermal expansion characteristics to prevent interconnect fatigue and maintain the electrical and mechanical integrity of the interconnects. Such an underfill material is difficult to incorporate in current manufacturing practices. For example, an assembler of electronic equipment can no longer simply solder a semiconductor device into place on a circuit board, but rather, must employ additional underfill steps, requiring extensive curing times, thus negatively impacting throughput.

Accordingly, it is well understood that improved electrical interconnections, both first-level and second-level packaging interconnections, are desirable and needed in the art.

Figure 1:
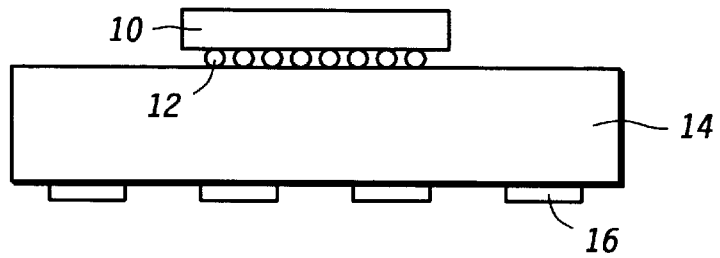
FIG. 1 illustrates a step of providing a conventional substrate/die assembly.
Figure 2:
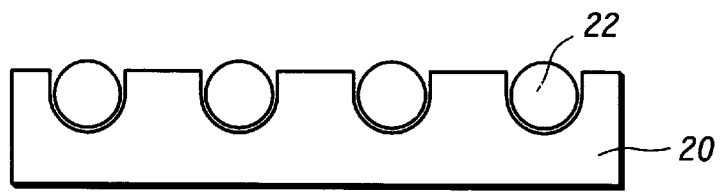
FIG. 2 illustrates a carrier having a plurality of solder spheres which are to be attached to a major surface of the substrate shown in FIG. 1.
Figure 3:
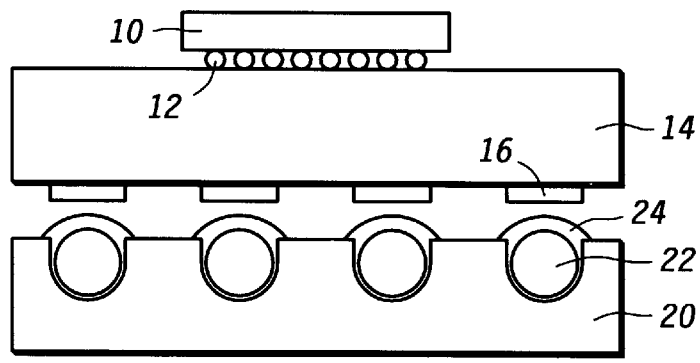
FIG. 3 illustrates a step of attaching the solder spheres of FIG. 2 to the substrate/die assembly of FIG. 1.
Figure 4:
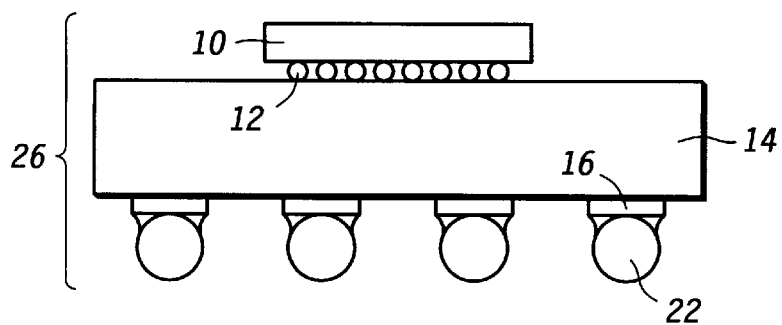
FIG. 4 illustrates the final substrate/die assembly, particularly a ceramic ball grid array according to the state of the art.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

The term "solder spheres" as used herein encompasses generally spherical solder components including those that are not reflowed and those that are reflowed. Reflowed solder spheres are also alternatively referred to as solder bumps.

Figure 5:
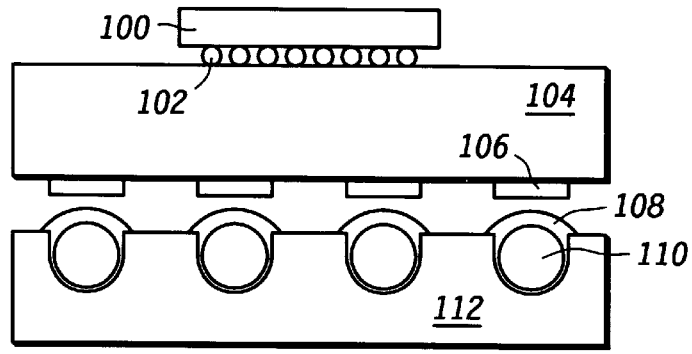
FIG. 5 illustrates a step according to the present invention, similar to the step shown in FIG. 3 in connection with the state of the art.

FIGS. 5–8 show a process flow for forming an embodiment of the present invention. As shown in FIG. 5, a ceramic substrate 104 having a plurality of solder pads 106 is provided. A semiconductor die 100 having a plurality of bumps 102 is placed onto the ceramic substrate. The bumps 102 are comprised of a high melting temperature solder, typically containing at least 85% Pb, such as 90 Pb/10 Sn. Further, a graphite boat 112 (a carrier) is provided, having a first set of solder spheres 110. As shown, a solder paste 108 is screen-printed on the solder spheres. Like the bumps 102, the solder spheres 110 are also formed of a high melting temperature solder, such as 90 Pb/10 Sn. The solder paste 108 includes flux and low melting temperature solder, typically containing at least 60% Sn, such as 63 Sn/37 Pb. While a ceramic substrate is described herein, the substrate may also be plastic, which forms a PBGA, or a tape as known in the art.

Figure 6:
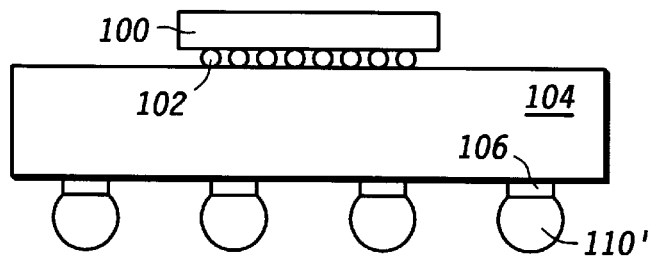
FIG. 6 illustrates a step of reflowing the solder spheres attached in FIG. 5.

After stacking of the component shown in FIG. 5, the structure is subjected to a high temperature treatment, such as on the order of 360° C. During high temperature exposure, the bumps 102 reflow so as to provide electrical connection between the semiconductor die 100 and the ceramic substrate 104. At the same time, the first set of solder spheres 110 reflow and consume solder paste 108 so as to provide an electrical interconnection component for second level interconnection from the ceramic substrate 104. FIG. 6 shows the structure after reflow, a depicting reflowed solder spheres 110'. While the reflowed solder spheres 110' are attached along a first major surface of the ceramic substrate 104 and the bumps 102 are attached along a second major surface of the substrate 104, both the spheres 110' and the bumps 102 may be attached to the same major surface, such as in the case of a tape substrate, rather than a ceramic or plastic substrate, as known in the art.

While, as shown in FIGS. 5 and 6 and described above, a solder paste 108 was utilized to effect joining of the solder spheres to the ceramic substrate, a solder flux may be utilized. In addition, while one reflow step provides for attachment of the semiconductor die 100 to the ceramic substrate 104 and attachment of the solder spheres 110 to the ceramic substrate 104, those attachment steps may be carried out separately. For example, solder spheres 110 may be attached after a high temperature reflow step to effect attachment of semiconductor die 100 to ceramic substrate 104. In such a case, the solder spheres 110 would not reflow to form reflow solder spheres 110', but would largely maintain their original shape. In addition, solder spheres 110 may be replaced with a lower melting temperature solder such as a higher tin content solder.

Figure 7:
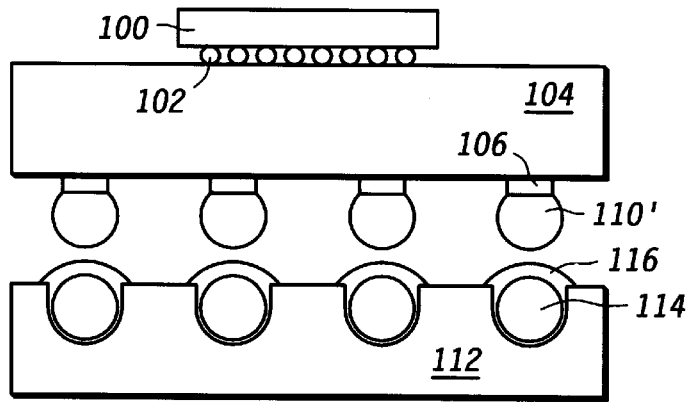
FIG. 7 illustrates a step of attaching a second set of solder spheres to the first set of solder spheres, according to a particular feature according to the present invention.

Turning to FIG. 7, a particular step according to one embodiment of the present invention is depicted, wherein a second set of solder spheres 114 are placed in graphite boat 112, the second set of solder spheres 114 being coated with a solder paste 116, similar to that shown above in FIG. 5. The ceramic substrate bearing the first set of solder spheres (now reflowed solder spheres 110') and the graphite boat bearing the second set of solder spheres 114 are brought together and heated so as to effect attachment of the second set of solder spheres 114 to the reflowed solder spheres 110'. The second set of solder spheres 114 is attached by heating to a lower temperature than that used for attachment of the first set of solder spheres 110. Particularly, a temperature not less than 200° C., such as approximately 210° C., is utilized to melt the solder component in the solder paste 116, which in turn forms solder connection 118 shown more clearly in FIG. 8. Since a lower temperature is used to effect connection of the second set of solder spheres 114 with respect to connection of the first set of solder spheres 110, the first set of solder spheres 110 remain in a fixed position, thereby facilitating easy vertical alignment between the first and second sets of solder spheres. Further, the second set of solder spheres are not deformed due to the relatively low temperature attachment.

Figure 8:
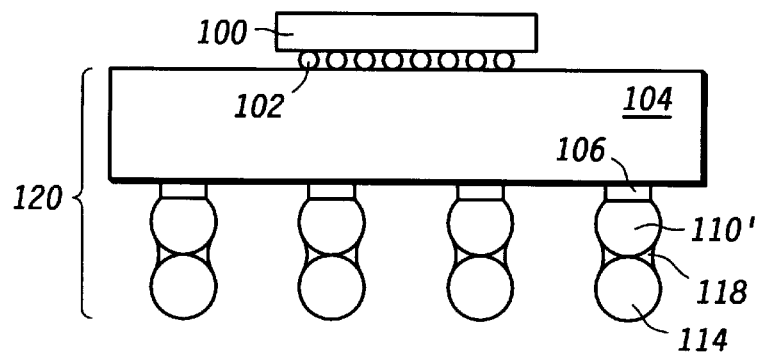
FIG. 8 shows the finished substrate/die assembly according to one embodiment of the present invention, particularly a ceramic ball grid array.

According to the present invention that employs first and second sets of solder spheres that are stacked onto each other as shown in FIG. 8, the CBGA package 120 (a substrate-die assembly) may be attached to a printed circuit board with increased standoff, that is, an increase in spacing between the ceramic substrate 104 and the printed circuit board (not shown). According to this embodiment of the present invention, the increased standoff is effective to accommodate shear strain caused by thermal expansion coefficient mismatch between the ceramic substrate and the printed circuit board, thereby resisting breakage of the solder connections. Accordingly, long term durability and reliability are improved. For example, testing has demonstrated that the electrical interconnect structure according to the present invention including first and second stacked solder spheres provides a 50% improvement in long term solder joint reliability. Here, long term durability was determined by measuring the number of thermal cycles to failure. Conventional 32×32 millimeter CBGA packages fail after approximately 600 cycles. Testing has shown that the structure illustrated in FIG. 8 extends long term durability of 32×32 millimeter CBGA packages to 900 cycles, a 50% improvement. Furthermore, by manipulating the particular volume of solder paste 116 utilized to interconnect the first and second sets of solder spheres together, a further improvement was realized. For example, as described in more detail in connection with FIG. 11 below, an "hour-glass" configuration demonstrated an extended long term durability, particularly, 2,000 cycles.

Figure 9:
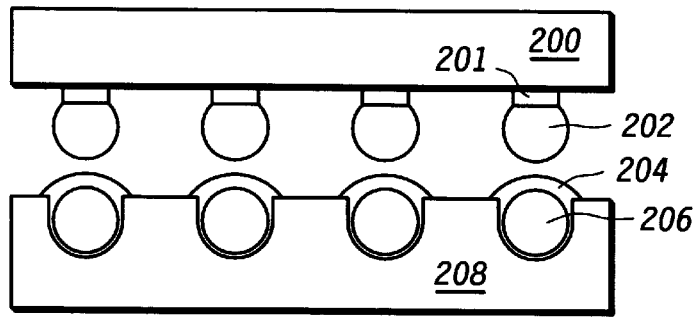
FIGS. 9 and 10 illustrates first and second steps according to another embodiment of the present invention, wherein first and second sets of solder spheres are attached to a semiconductor die, for later attachment to a substrate or printed circuit board.
Figure 10:
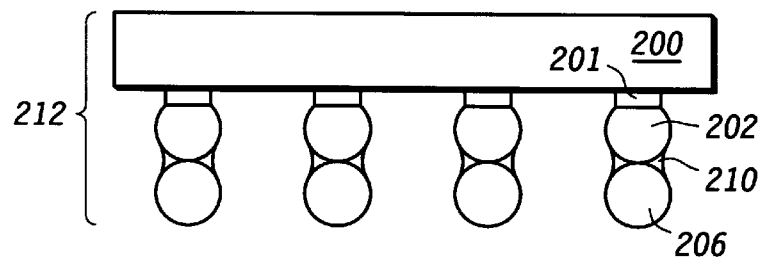

Turning to FIGS. 9 and 10, a second embodiment of the present invention is illustrated, wherein the stacked sets of solder spheres are utilized in connection with a semiconductor die. More particularly, die 200 is provided having a plurality of pad limiting metallurgy (PLM) areas 201, which provide bump sites. A first set of solder spheres 202 are placed respectively along PLM areas 201, along a major surface thereof. It is noted that the solder spheres.202 have the "bump" shape shown in FIG. 9 due to reflow of the solder spheres after deposition thereof. It is noted that the first set of solder spheres 202 may be provided on the semiconductor die 200 utilizing conventional C4 technology. However, the first set of solder spheres 202 may be formed on the bumped die utilizing newer technologies, including screen-printing and the vacuum stencil method described in co-pending application Ser. No. 08/939,641, filed Sep. 29, 1997, a subject matter thereof being incorporated herein by reference thereto.

Further, a graphite boat 208 is provided having a second set of solder spheres 206, on which solder paste 204 is screen-printed. Like the embodiments described above, the first and second sets of solder spheres 202 and 206 are formed of a high melting temperature solder such as 90 Pb/10 Sn. In addition, the solder paste 204 is formed of a low melting temperature solder, such as 63 Sn/37 Pb, and flux.

After the semiconductor die 200 and the second set of solder spheres 206 are brought together, heating is carried out at a relatively low temperature, such as 210° C., to form the bumped die 212 shown in FIG. 10. As depicted, the bumped die 212 includes solder connections 210, the material thereof being provided by melting and solidification of solder paste 204 (i.e., reflowed solder material).

Figure 11:
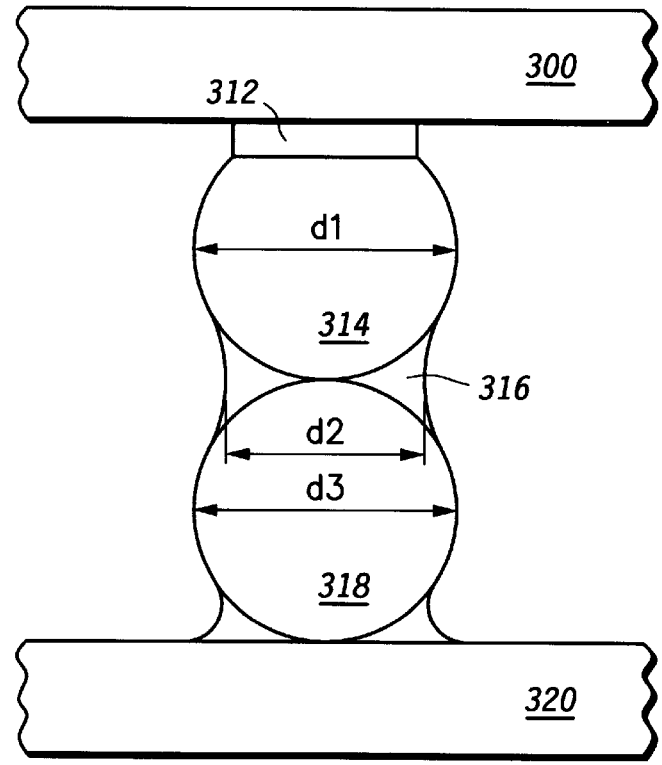
FIG. 11 illustrates an exploded view of an electrical interconnect structure according to one embodiment of the present invention wherein first and second spheres are stacked on each other.

FIG. 11 illustrates an exploded view of the electrical interconnect structure according to one embodiment of the present invention. The interconnect structure may be utilized in various applications. As shown, the electrical interconnect structure is provided to effect electrical and mechanical connection between a first component 300 and a second component 320. More particularly, first component 300 includes a solder pad 312 on which is provided a first solder sphere 314 having a first diameter D1. Second component 320 has a second solder sphere 318 having a third diameter D3. First and second solder spheres 314 and 318 are bonded together via solder connection 316, having second diameter D2. According to this particular embodiment of the present invention, diameter D2 is less than diameter D1 and is less than diameter D3. The overall configuration of the electrical interconnect structure shown in FIG. 11 is that of an hourglass. According to this shape, further enhanced reliability has been achieved, as noted above. According to the electrical interconnect structure shown in FIG. 11, the zone of failure, that is, electrical and/or mechanical failure along the interconnect structure, is shifted from the interface between first component 300 and first solder sphere 314, to the interfacial region between first and second solder spheres 314 and 318, defined by solder connection 316. This shifting in the failure zone of the electrical interconnect structure is responsible for enhanced durability, increased reliability and longer life. The shape of the electrical interconnection is maintained by reflowing solder paste to form solder connection 316 at a temperature low enough to prevent reflow of the first and second solder spheres 314 and 318 (i.e., the first and second solder spheres remain intact). By preventing reflow of the solder spheres, the volume of solder connection 316 may be manipulated easily to shift the failure zone to the interfacial region.

While the present invention has been described herein with particular detail with respect to embodiments of the present invention, it is well understood that one of ordinary skill in the art may modify the present invention without departing from the spirit and scope of the claims attached herein.

What is claimed is:

1. A method of bumping a semiconductor die, comprising the steps of:
   providing a semiconductor die having a bump site, the bump site having a first solder sphere attached thereto; and
   attaching a second solder sphere to the first solder sphere such that the first and second solder spheres are stacked on each other by applying a solder paste between the first and second solder spheres, and heating the first and second solder spheres to a temperature at which the solder paste reflows and the first and second solder spheres are not reflowed.

2. The method of claim 1, wherein the first and second solder spheres are comprised of a solder containing at least 85% Pb.

3. The method of claim 2, wherein the solder paste comprises flux and a solder component, the solder component containing at least 60% Sn.

4. The method of claim 3, wherein the temperature is not less than 200° C.

5. The method of claim 1, wherein the second solder sphere is placed on a carrier, and the solder paste is printed on the second solder sphere prior to attaching to the first solder sphere.

6. The method of claim 1, wherein the semiconductor die includes a plurality of first solder spheres and a plurality of second solder spheres, wherein the plurality of second solder spheres are respectively attached to the plurality of first solder spheres.

7. The method of claim 1, wherein the first solder sphere is reflowed prior to the step of attaching the second solder sphere.

8. A method of packaging a semiconductor die, comprising the steps of:
   attaching a plurality of first solder spheres to a substrate, the substrate having a first major surface and a second major surface opposite the first major surface, wherein the plurality of first solder spheres are attached along the first major surface and the substrate has a semiconductor die attached to one of the first major surface and the second major surface; and
   attaching a plurality of second solder spheres respectively to the plurality of first solder spheres, such that each second solder sphere of the plurality of second solder spheres is stacked onto a respective first solder sphere of the plurality of first solder spheres, wherein said each second solder sphere is attached to said respective first solder sphere by applying a solder paste therebetween and heating the solder paste to a temperature at which the solder paste reflows and said each second solder sphere and said respective first solder sphere does not reflow.

9. The method of claims 8, wherein the plurality of first solder spheres and the plurality of second solder spheres are comprised of a solder containing at least 85% Pb.

10. The method of claim 9, wherein the solder paste comprises flux and a solder component, the solder component containing at least 60% Sn.

11. The method of claim 10, wherein the temperature is not less than 200° C.

12. The method of claim 8, wherein the plurality of second solder spheres is placed on a carrier, and the solder paste is printed on the plurality of second solder spheres prior to attaching to the plurality of first solder spheres.

13. The method of claim 8, wherein the plurality of first solder spheres are reflowed prior to the step of attaching.

14. The method of claim 8, wherein the semiconductor die is attached to the second major surface of the substrate.

15. The method of claim 14, wherein the substrate is comprised of ceramic.

16. The method of claim 14, wherein the substrate is comprised of plastic.

17. The method of claim 8, wherein the semiconductor die is attached to the first major surface of the substrate.

18. The method of claim 17, wherein the substrate is comprised of a tape.

19. The method of claim 8, further comprising a step of attaching the semiconductor die to the substrate, wherein the step of attaching the semiconductor die to the substrate and the step of attaching the plurality of first solder spheres are carried out simultaneously.

* * * * *